(12) United States Patent
Li et al.

(10) Patent No.: US 12,193,263 B2
(45) Date of Patent: Jan. 7, 2025

(54) DISPLAY PANEL, MANUFACTURING METHOD THEREOF, AND DISPLAYING DEVICE

(71) Applicant: BOE Technology Group Co., Ltd., Beijing (CN)

(72) Inventors: Duohui Li, Beijing (CN); Kang Guo, Beijing (CN); Mengya Song, Beijing (CN); Zhen Liu, Beijing (CN); Xiao Zhang, Beijing (CN); Xin Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 32 days.

(21) Appl. No.: 18/208,212

(22) Filed: Jun. 9, 2023

(65) Prior Publication Data
US 2023/0329034 A1 Oct. 12, 2023

Related U.S. Application Data

(63) Continuation of application No. 17/356,391, filed on Jun. 23, 2021, now Pat. No. 11,716,873.

(30) Foreign Application Priority Data

Nov. 19, 2020 (CN) .......................... 202011302231.X

(51) Int. Cl.
*H10K 50/858* (2023.01)
*H10K 50/80* (2023.01)
(Continued)

(52) U.S. Cl.
CPC ......... *H10K 50/858* (2023.02); *H10K 50/868* (2023.02); *H10K 59/351* (2023.02); *H10K 59/38* (2023.02)

(58) Field of Classification Search
CPC .. H10K 50/858; H10K 50/879; H10K 50/868; H10K 50/8793; G02B 3/0056;
(Continued)

(56) References Cited

U.S. PATENT DOCUMENTS

2008/0094547 A1* 4/2008 Sugita .................. G02B 5/3058
359/487.03
2015/0145975 A1 5/2015 Ko
(Continued)

FOREIGN PATENT DOCUMENTS

CN 204883135 U 12/2015
CN 106054398 A 10/2016
(Continued)

OTHER PUBLICATIONS

CN202011302231.X first office action.
(Continued)

*Primary Examiner* — Angela M. Medich
(74) *Attorney, Agent, or Firm* — IPro, PLLC

(57) ABSTRACT

Disclosed are a display panel, a manufacturing method thereof, and a displaying device. The display panel comprises a pixel layer, a support layer, a lens unit and a cover plate which are stacked in sequence. The support layer is located on a luminescent layer of the pixel layer. The lens unit comprises a lens layer, wherein the lens layer comprises a lens area and a non-lens area, and the lens area comprises multiple lenses arranged in an array. The display panel further comprises a polarization unit disposed on a light path between the pixel layer and the lens layer and configured to filter out light emitted from the pixel layer to the non-lens area.

20 Claims, 7 Drawing Sheets

(51) Int. Cl.
*H10K 59/35* (2023.01)
*H10K 59/38* (2023.01)

(58) Field of Classification Search
CPC .... G02B 3/0006; G02B 30/27; G02B 5/3058; G02F 1/133528; G02F 1/133548
See application file for complete search history.

(56) References Cited

U.S. PATENT DOCUMENTS

| | | |
|---|---|---|
| 2016/0064694 A1 | 3/2016 | Choi et al. |
| 2019/0235321 A1 | 8/2019 | Zhou et al. |
| 2021/0343895 A1 | 11/2021 | Pan |
| 2022/0308349 A1 | 9/2022 | Yan et al. |

FOREIGN PATENT DOCUMENTS

| | | |
|---|---|---|
| CN | 110928017 A | 3/2020 |
| CN | 110928021 A | 3/2020 |
| CN | 111175982 A | 5/2020 |

OTHER PUBLICATIONS

U.S. Appl. No. 17/356,391 Non-Final Office Action dated Mar. 2, 2023.
U.S. Appl. No. 17/356,391 Notice of Alllowance dated May 9, 2023.

* cited by examiner

DISPLAY PANEL, MANUFACTURING METHOD THEREOF, AND DISPLAYING DEVICE

CROSS REFERENCE TO RELEVANT APPLICATIONS

The application is a continuation application of U.S. application Ser. No. 17/356,391, filed on Jun. 23, 2021, and claims benefit of the filing date of Chinese Patent Application No. 202011302231.X, entitled "DISPLAY PANEL, MANUFACTURING METHOD THEREOF, AND DISPLAYING DEVICE", filed with the China National Intellectual Property Administration on Nov. 19, 2020, the disclosure of which is hereby incorporated in its entirety by reference.

TECHNICAL FIELD

The disclosure relates to the technical field of display, in particular to a display panel, a manufacturing method thereof, and a displaying device.

BACKGROUND

The development of the industrial technology leads to an ever-higher requirement for the microminiaturization of optical devices, and micro-lenses come into being, accordingly. Micro-lenses are lenses with an aperture from the micrometer scale to the millimeter scale, and a certain number of micro-lenses are arrayed regularly according to a specific rule or irregularly to form a micro-lens array.

Compared with traditional lenses, the micro-lens array has the advantages of small size, light weight, low power consumption, and the like, and has optical properties that are not processed by traditional optical devices, thus endowing devices with many special functions. In the technical field of display, naked-eye 3D display may be realized by means of the micro-lens array.

SUMMARY

The embodiments of the disclosure provide a display panel, a manufacturing method thereof, and a displaying device.

The embodiments of the disclosure using the following technical solutions:

In the first aspect, provides a display panel, the display panel comprising a pixel layer, a support layer, a lens unit and a cover plate which are stacked in sequence; the support layer is located on a light-emitting side of the pixel layer;
the lens unit comprises a lens layer, the lens layer comprises a lens area and a non-lens area, and the lens area comprises multiple lenses arranged in an array; and
the display panel further comprises a polarization unit disposed on a light path between the pixel layer and the lens layer and configured to filter out light emitted from the pixel layer to the non-lens area.

Optionally, the polarization unit comprises a first polarization layer and a second polarization layer, wherein the first polarization layer is closer to the pixel layer than the second polarization layer, and a transmission axis of the first polarization layer is perpendicular to a transmission axis of the second polarization layer.

Optionally, the first polarization layer is located between the pixel layer and the support layer, and the second polarization layer is located between the support layer and the lens layer.

Optionally, the first polarization layer and the second polarization layer are both located between the support layer and the lens layer.

Optionally, the first polarization layer comprises a first wire grid polarizer, and the second polarization layer comprises a second wire grid polarizer;
wherein, the first wire grid polarizer comprises multiple parallel first protrusions arranged in a first direction;
the second wire grid polarizer comprises multiple parallel second protrusions arranged in a second direction;
an area where the first protrusions are located and an area where the second protrusions are located correspond to the non-lens area, and the first direction is perpendicular to the second direction.

Optionally, in case where the first polarization layer is located between the pixel layer and the support layer and the second polarization layer is located between the support layer and the lens layer, the first polarization layer further comprises a first inorganic layer and a first organic layer, and the second polarization layer further comprises a second inorganic layer and a second organic layer;
the first organic layer is disposed on a side, close to the support layer, of the pixel layer, the multiple first protrusions are disposed on a side, close to the support layer, of the first inorganic layer, and the first organic layer covers the multiple first protrusions; and
the second inorganic layer is disposed on a side, close to the support layer, of the lens layer, the multiple second protrusions are disposed on a side, close to the support layer, of the second organic layer, and the second organic layer is disposed on sides, close to the support layer, of the multiple second protrusions.

Optionally, in case where the first polarization layer is located between the pixel layer and the support layer and the second polarization layer is located between the support layer and the lens layer, the first polarization layer further comprises a third organic layer, and the second polarization layer further comprises a fourth organic layer;
the multiple first protrusions are formed on a side, close to the pixel layer, of the support layer, and the third organic layer is disposed on sides, close to the pixel layer, of the multiple first protrusions; and
the multiple second protrusions are formed on a side, close to the lens layer, of the support layer, and the fourth organic layer covers the multiple second protrusions.

Optionally, in case where the first polarization layer and the second polarization layer are both located between the support layer and the lens layer, the first polarization layer further comprise a third inorganic layer, and the second polarization layer further comprises a fifth organic layer;
the multiple first protrusions are formed on a side, close to the lens layer, of the support layer, and the third inorganic layer covers the multiple first protrusions; and
the multiple second protrusions are formed on a side, close to the lens layer, of the third inorganic layer, and the fifth organic layer covers the multiple second protrusions.

Optionally, the first polarization layer comprises a first polarizer, and the second polarization layer comprises a second polarizer;

wherein, a transmission axis of the first polarizer is perpendicular to a transmission axis of the second polarizer, the first polarizer and the second polarizer each comprise a light-transmitting portion and a polarization portion, areas where the polarization portions are located correspond to the non-lens area, and areas where the light-transmitting portions are located correspond to the lens area.

Optionally, the display panel further comprises a third polarizer located on a side, close to the support layer, of the pixel layer; and the polarization unit comprises a third polarization layer, and a transmission axis of the third polarization layer is perpendicular to a transmission axis of the third polarizer.

Optionally, the third polarization layer comprises a third wire grid polarizer, and the third wire grid polarizer comprises multiple parallel third protrusions arranged in a third direction;

wherein, the transmission axis of the third polarizer is perpendicular to the third direction.

Optionally, the third polarization layer is located on a side, close to the support layer, of the lens layer.

Optionally, the lens unit further comprises a dimming layer, the dimming layer is located on a side, away from the support layer, of the lens layer and covers the lens layer, and a refractive index of the lenses is different from a refractive index of the dimming layer.

Optionally, the refractive index of the dimming layer is greater than the refractive index of the lenses.

Optionally, the lenses are micro-lenses.

Optionally, in a direction parallel to the support layer, a cross-section of the lenses is circular, elliptical, square or rectangular.

Optionally, in case where the display panel is an RGB OLED display panel, the pixel layer comprises a luminescent layer; and the luminescent layer comprises at least one of a red luminescent layer, a green luminescent layer and a blue luminescent layer.

Optionally, in case where the display panel is a WOLED display panel, the pixel layer comprises a color filter layer, and the display panel further comprises a luminescent layer; and the luminescent layer is disposed on a side, away from the support layer, of the pixel layer, and is used to emit white light.

On another aspect, provides a displaying device, comprising the above display panel.

On another aspect, provides a manufacturing method of the above display panel, comprising:

forming the pixel layer, the support layer, the lens unit and the cover plate which are stacked in sequence; and forming the polarization unit.

The aforesaid description is merely a brief summary of the technical solution of the disclosure. To allow those skilled in the art to gain a better understanding of the technical means of the disclosure so as to implement the disclosure according to the contents in the specification and to make the above and other purposes, features and advantages of the disclosure clearer, specific implementations of the disclosure are given below.

BRIEF DESCRIPTION OF THE DRAWINGS

To more clearly explain the technical solutions of the embodiments of the disclosure or related arts, drawings required for describing the embodiments of the disclosure or the related arts will be briefly introduced below. Obviously, the drawings in the following description only illustrate some embodiments of the invention, and those ordinarily skilled in the art may obtain other drawings according to the following ones without creative labor.

DETAILED DESCRIPTION

The technical solutions of the embodiments of the disclosure will be clearly and comprehensively described below in conjunction with the drawings of the embodiments. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

In the embodiments of the disclosure, terms such as "first", "second", "third", "fourth" and "fifth" are used to distinguish identical or similar items with basically the same function and effect merely for the purpose of clearly describing the technical solutions of the embodiments of the disclosure, and should not be construed as indicating or implying relative importance or implicitly indicating the number of technical features referred to.

In the embodiments of the disclosure, "multiple" refers to two or more, and "at least one" refers to one or more, unless otherwise clearly specified.

In the embodiments of the disclosure, terms such as "upper" and "lower" are used to indicate directional or positional relations based on the accompanying drawings merely for the purpose of facilitating and simplifying the description of the disclosure, do not indicate or imply that devices or elements referred to must be in a specific direction, or be configured and operated in a specific direction, and thus should not be construed as limitations of the disclosure.

Figure 1:
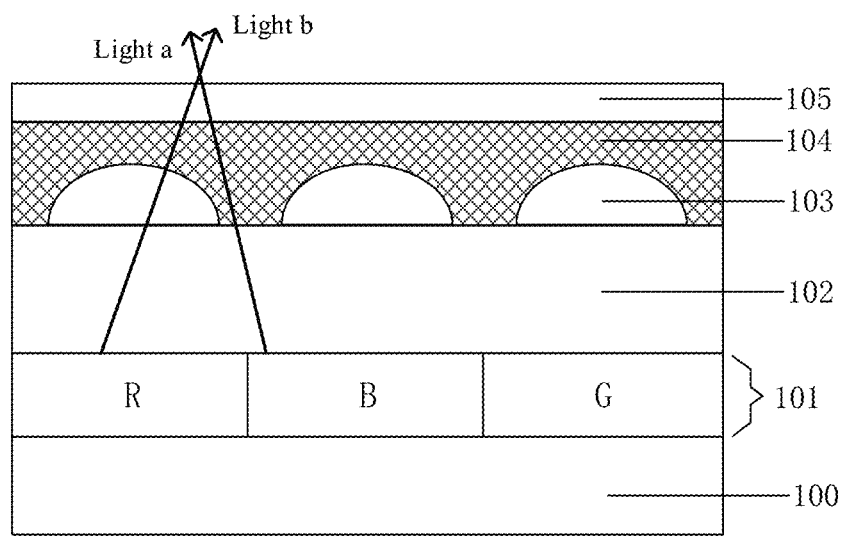
FIG. 1 is a structural diagram of a display panel subjected to interference according to one embodiment of the disclosure.

Referring to FIG. 1, a 3D display panel comprises a display luminescent layer 100, a filter layer 101, a flat layer 102, a lens array, a low-refractive index adhesive layer 104 and cover glass which are stacked in sequence, wherein the lens array comprises multiple spherical lenses 103 arranged in an array, and the filter layer 101 comprises a red filter layer R, a blue filter layer B and a green filter layer G. When the 3D display panel is used for 3D display, light emitted from the filter layer 101 to an area between the adjacent spherical lenses 103 (such as light a in FIG. 1) will disturb light radiated to the spherical lenses 103 (such as light b in FIG. 1) to cause interference, which greatly reduces the 3D display effect and the watch experience.

Figure 3:
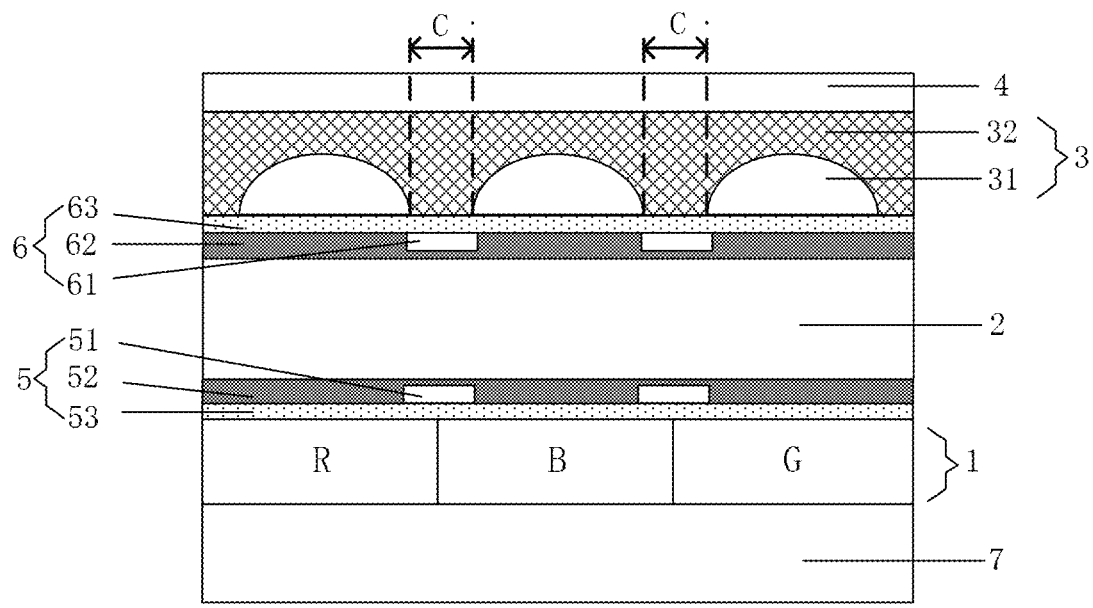
FIG. 3 is a structural diagram of a display panel according to one embodiment of the disclosure.
Figure 4:
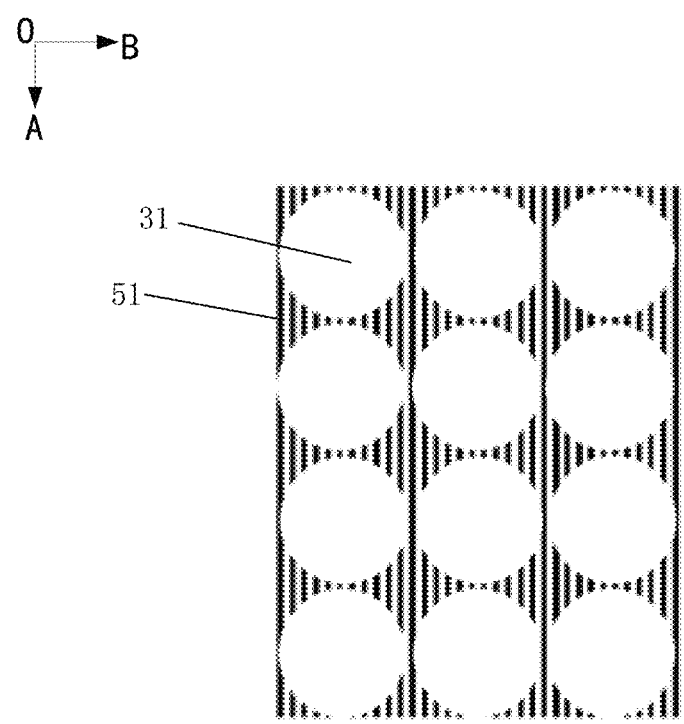
FIG. 4 is a top view of a lens layer and a first wire grid polarizer in FIG. 3.

In view of this, the embodiments of the disclosure provide a display panel which, as shown in FIG. 3 and FIG. 4, comprises a pixel layer 1, a support layer 2, a lens unit 3 and a cover plate which are stacked in sequence, wherein the support layer 2 is located on a light-emitting side of the pixel layer 1.

Referring to FIG. 3 and FIG. 4, the lens unit 3 comprises a lens layer, wherein the lens layer comprises a lens area and a non-lens area, and the lens area comprises multiple lenses 31 arranged in an array.

The display panel further comprises a polarization unit disposed on a light path between the pixel layer and the lens layer and configured to filter out light emitted from the pixel layer to the non-lens area.

As shown in FIG. 3, the polarization unit may comprise a first polarization layer 5 and a second polarization layer 6, wherein the first polarization layer 5 is closer to the pixel layer 1 than the second polarization layer 6, and a transmission axis of the first polarization layer 5 is perpendicular to a transmission axis of the second polarization layer 6.

The polarization unit is disposed on the light path between the pixel layer and the lens layer, that is to say, the polarization unit may be disposed between the pixel layer and the support layer, between the support layer and the lens layer, or between the pixel layer and the support layer as well as between the support layer and the lens layer. Of course, the polarization unit may also be disposed in other manners, the disclosure has no specific limitation in this aspect, and the arrangement of the polarization unit may be determined according to the specific structure of the polarization unit.

The lens layer comprises the lens area and the non-lens area. The lenses are disposed in the lens area and may be micro-lenses, and the non-lens area is an area except for the lens region. The specific range of the non-lens area depends on the arrangement manner of the multiple lenses. The multiple lenses constitute a non-contact lens array (a gap is reserved between every two adjacent lenses 31, as shown in FIG. 3); or, the multiple lenses constitute a contact-type lens array (every two adjacent lenses are connected). The disclosure has no limitation in this aspect. The drawings of the embodiments of the disclosure are drawn with the non-contact lens array as an example.

The disclosure has no limitation to the material of the support layer. Illustratively, the support layer may be made of an organic light-transmitting material which specifically may be any one of polystyrene, polycarbonate, polyethylene, polypropylene, polyvinyl chloride, polyethylene terephthalate, polymethyl methacrylate, and acrylic acid, and in this case, the support layer has a planarization effect. Or, the support layer may be made of an organic light-transmitting material which specifically may be optical glass.

The disclosure has no limitation to the shape of the lenses. Illustratively, the lenses may be hemispherical lenses shown in FIG. 3 and FIG. 4, or cylindrical lenses. The cross-section of the lenses in a direction parallel to the support layer may be circular, elliptical, square, rectangular, or the like.

The disclosure has no limitation to the specific material of the lenses. Illustratively, the lenses may be made of an inorganic light-transmitting material such as quartz glass; or, the lenses may be made of an organic light-transmitting material such as acrylic resin. The disclosure has no limitation to the manufacturing method of the lens layer. Illustratively, the lens layer may be manufactured by a nano-imprinting process or a thermal reflux process.

To realize better 3D display, the lens unit 3 may further comprise a dimming layer 32, as shown in FIG. 3, wherein the dimming layer 32 is located on a side, away from the support layer 2, of the lens layer and covers the lens layer, and the refractive index of the lenses is different from the refractive index of the dimming layer.

The disclosure has no limitation to the type of the display panel. Illustratively, the display panel may be any one of an organic light emitting diode (OLED) display panel, a Micro LED display panel and a Mini LED display panel; wherein, the OLED display panel may be a WOLED display panel, and pixels of the WOLED display panel emit white light, so a color filter layer needs to be additionally arranged to realize color display; or, the OLED display panel may be an RGB OLED display panel, pixels of the RGB OLED are able to directly emit light in different colors, so a color filter layer does not need to be arranged anymore. Or, the display panel may be a liquid crystal display (LCD) display panel.

If the display panel is an RGB OLED display panel, the pixel layer may comprise a luminescent layer. The pixel layer may comprise a red luminescent layer, a green luminescent layer and a blue luminescent layer. Or, the pixel layer may only comprise a luminescent layer in one color. The disclosure has no limitation in this aspect, and the specific configuration may be determined as actually needed.

If the display panel is a WOLED display panel or an LCD display panel, the pixel layer may comprise a color filter layer. As shown in FIG. 3, the pixel layer 1 may comprise a red filter layer R, a green filter layer G and a blue filter layer B. Of course, the pixel layer may only comprise a filter layer in one color. The disclosure has no limitation in this aspect, and the specific configuration may be determined as actually needed. Furthermore, in case where the display panel is a WOLED display panel, the display panel may further comprise, as shown in FIG. 3, a luminescent layer, wherein the luminescent layer 7 is disposed on a side, away from the support layer 2, of the pixel layer 1 and is able to emit white light. In case where the display panel is an LCD display panel, the display panel may further comprise a liquid crystal layer, an array substrate and a backlight module, wherein light emitted by the backlight module sequentially passes through the array substrate and the liquid crystal layer to be irradiated to the pixel layer. It should be noted that the drawings of the embodiments of the disclosure are drawn in case where the display panel is a WOLED display panel and the pixel layer comprises a red filter layer R, a green filter layer G and a blue filter layer B.

Figure 2:
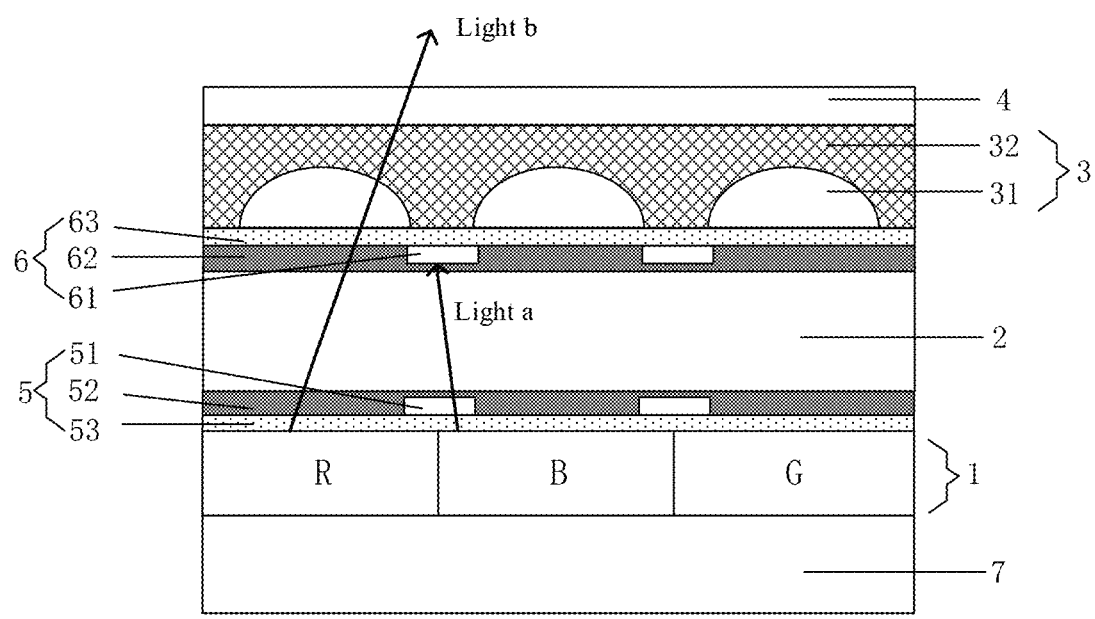
FIG. 2 is a principle diagram of a display panel capable of avoiding interference according to one embodiment of the disclosure.

As shown in FIG. 2, when the display panel provided by the embodiments of the disclosure is used for 3D display, the light a (stray light) emitted from the pixel layer 1 to the non-lens area is filter out by the polarization unit, so that the light b radiated to the lens-area will not be distributed by the stray light, thus avoiding interference caused by the stray light and improving the 3D display effect and the watch experience.

Optionally, the polarization unit comprises a first polarization layer and a second polarization layer, wherein the first polarization layer is closer to the pixel layer than the second polarization layer, and a transmission axis of the first polarization layer is perpendicular to a transmission axis of the second polarization layer.

The disclosure has no limitation to the specific position and structure of the first polarization layer and the second polarization layer.

Because the transmission axis of the first polarization layer is perpendicular to the transmission axis of the second polarization layer, light emitted from the pixel layer to the non-lens area will be blocked by the second polarization layer after passing through the first polarization layer, and will not be radiated to the non-lens area, so that light emitted from the pixel layer to the lens area will not be distributed, thus avoiding interference and improving the 3D display effect and the watch experience.

Figure 5:
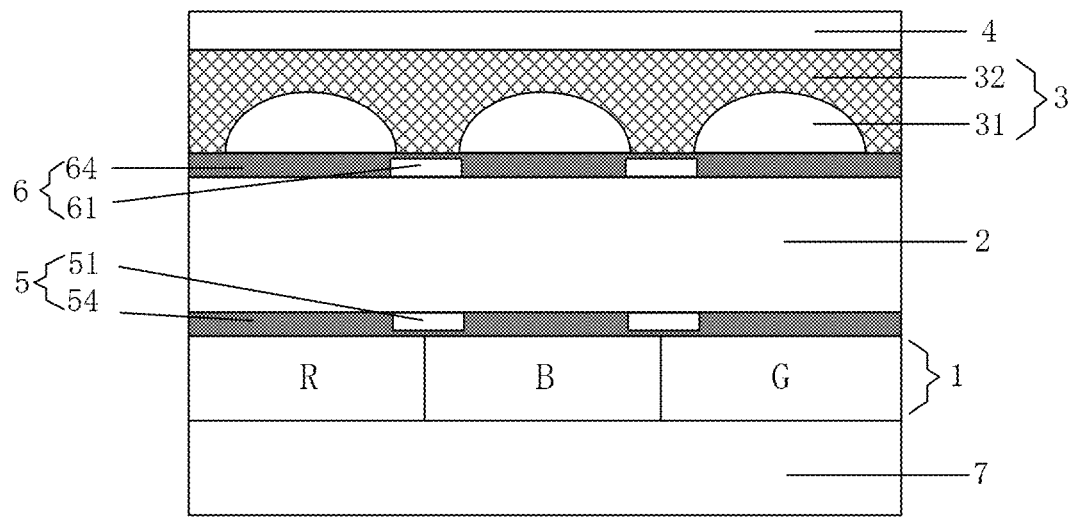
FIG. 5 is a structural diagram of a display panel according to another embodiment of the disclosure.

Optionally, as shown in FIG. 3 and FIG. 5, the first polarization layer 5 is located between the pixel layer 1 and the support layer 2, and the second polarization layer 6 is located between the support layer 2 and the lens layer (not shown in FIG. 3 and FIG. 5). In this case, the support layer may be made of an organic light-transmitting material or an inorganic luminescent layer, which depends on different manufacturing processes.

Figure 6:
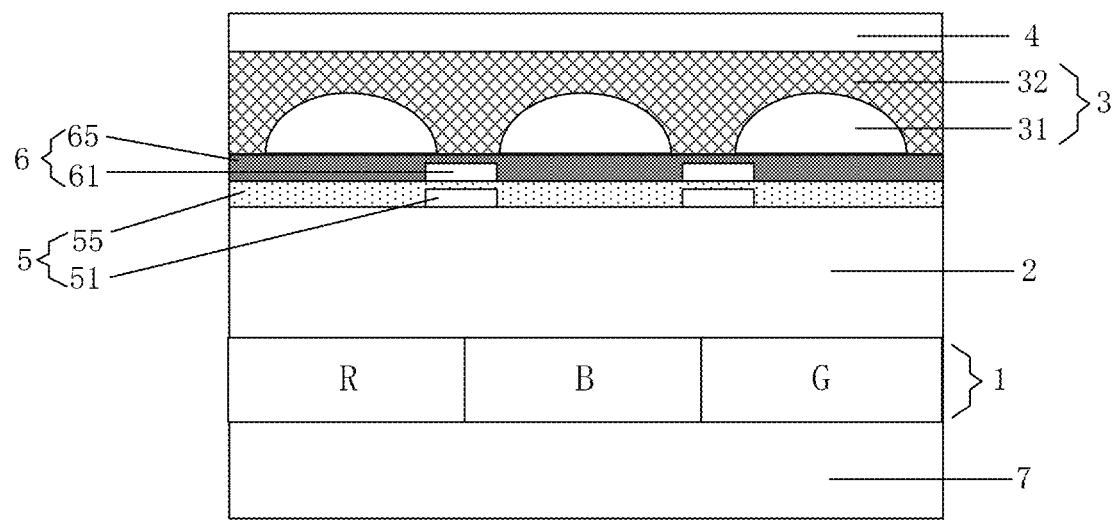
FIG. 6 is a structural diagram of a display panel according to another embodiment of the disclosure.

Optionally, as shown in FIG. 6, the first polarization layer 5 and the second polarization layer 6 are both located between the support layer 2 and the lens layer (not shown in FIG. 6). In this case, the support layer may be made of an inorganic light-transmitting material such as glass, so that the first polarization layer and the second polarization layer may be manufactured on a side, close to the lens layer, of the support layer. Of course, the support layer may also be made of an organic light-emitting material, and in this case, to facilitate the manufacturing of the first polarization layer, an inorganic layer may be disposed between the first polarization layer and the support layer to be used as anti-etching layer.

Two specific structures of the first polarization layers and the second polarization layer are provided below.

1. The first polarization layer comprises a first wire grid polarizer, and the second polarization layer comprises a second wire grid polarizer; wherein, as shown in FIG. 3, the first wire grid polarizer comprises multiple parallel first protrusions 51 arranged in a first direction; the second wire grid polarizer comprises multiple parallel second protrusions 61 arranged in a second direction; an area where the first protrusions are located and an area where the second protrusions are located correspond to the non-lens area, and the first direction is perpendicular to the second direction.

The first wire grid polarizer is a wire grid polarizer (WGP), and the multiple first protrusions form a grid and may be made of metal or metal alloy; and light is able to pass through an area between every two adjacent first protrusions. The shape of the first protrusions is not limited. Illustratively, the first protrusions 51 may be linear, as shown in FIG. 4. The structure of the second wire grid polarizer is similar to the structure of the first wire grid polarizer, and will no longer be detailed here.

The first direction is perpendicular to the second direction, so the direction of the first protrusions is perpendicular to the direction of the second protrusions, which ensures that the transmission axis of the first polarization layer is perpendicular to the transmission axis of the second polarization layer, and thus, light emitted from the pixel layer to the non-lens area will be blocked by the second wire grid polarizer after passing through the first wire grid polarizer, and will not be radiated to the non-lens area.

The first direction may be an OA direction shown in FIG. 4 (a long-side direction of the display panel), and the second direction may be an OB direction shown in FIG. 4 (a short-side direction of the display panel); or, the first direction may be the OB direction shown in FIG. 4 (the short-side direction of the display panel), and the second direction may be the OA direction shown in FIG. 4 (the long-side direction of the display panel). The disclosure has no limitation in this aspect. FIG. 4 is drawn with the OA direction as the first direction and the OB direction as the second direction. FIG. 4 only illustrates a top view of the first wire grid polarizer and the lens layer, but does not illustrate a top view of the second wire grid polarizer, and multiple second protrusions in the second wire grid polarizer may be arranged in the second direction (the OB direction).

It should be noted that the first polarization layer and the second polarization layer may comprise other film layers according to different manufacturing processes to facilitate the manufacturing of the wire grid polarizers.

Illustratively, as shown in FIG. 3, in case where the first polarization layer is located between the pixel layer and the support layer and the second polarization layer is located between the support layer and the lens layer, the first polarization layer 5 may further comprise a first inorganic layer 53 and a first organic layer 52, wherein the first inorganic layer 53 is disposed on a side, close to the support layer 2, of the pixel layer 1; the multiple first protrusions 51 are arranged on a side, close to the support layer 2, of the first inorganic layer 53; and the first organic layer 52 covers the multiple first protrusions 51 to protect the multiple first protrusions 51. The second polarization layer 6 may further comprise a second inorganic layer 63 and a second organic layer 62, wherein the second inorganic layer 63 is disposed on a side, close to the support layer 2, of the lens layer; the multiple second protrusions 61 are arranged on a side, close to the support layer 2, of the second inorganic layer 63; and the second organic layer 62 is arranged on sides, close to the support layer 2, of the multiple second protrusions 61 to protect and support the multiple second protrusions 61. That is, in the structure shown in FIG. 3, the multiple first protrusions 51 may be manufactured on a side, away from the pixel layer 1, of the first inorganic layer 63, and the multiple second protrusions 61 may be manufactured on a side, close to the support layer 3, of the second organic layer 63. In this structure, the support layer may be made of an organic light-transmitting material to fulfill a support effect. Of course, the support layer may also be made of an inorganic light-transmitting material, such as glass.

Of course, as shown in FIG. 5, the first polarization layer 5 may further comprise a third organic layer 54, wherein the third organic layer 54 is disposed on sides, close to the pixel layer 1, of the multiple first protrusions 51, and the multiple first protrusions 51 are formed on a side, close to the pixel layer, of the support layer 2. The second polarization layer 6 may further comprise a fourth organic layer 64, wherein the fourth organic layer 64 covers the multiple second protrusions 61, and the multiple second protrusions 61 are formed in a side, close to the lens layer, of the support layer 2. That is, in the structure shown in FIG. 5, the multiple first protrusions 51 and the multiple second protrusions 61 may be manufactured on two opposite sides of the support layer 2, respectively. In this structure, the support layer may be made of an inorganic light-transmitting layer (such as glass) to facilitate the fabrication of the wire grid polarizers and fulfill a good support effect. In addition, the third organic layer and the fourth organic layer may be replaced with inorganic layer. To guarantee the protection effect, the third organic layer and the fourth organic layer are preferred.

Illustratively, as shown in FIG. 6, in case where the first polarization layer and the second polarization layer are both located between the support layer and the lens layer, the first polarization layer 5 may further comprise a third inorganic layer 55 that covers the multiple first protrusions 51, and the second polarization layer 6 may further comprise a fifth organic layer 65 that covers the multiple second protrusions 61. That is, in the structure shown in FIG. 6, the multiple first protrusions 61 are formed on a side, close to the lens layer, of the support layer 2, and the multiple second protrusions 61 are formed on a side, close to the lens layer, of the third inorganic layer 55. In this structure, the support layer may be made of an inorganic light-transmitting material (such as glass) to facilitate the fabrication of the wire gird polarizers and fulfill a good support effect. In addition, the fifth organic layer may be replaced with an inorganic layer; to guarantee the protection effect, the fifth organic layer is preferred. The third inorganic layer may be replaced with an organic layer, and in this case, to facilitate the manufacturing of the multiple second protrusions, an inorganic layer may be manufactured on the third organic layer. To reduce the manufacturing processes and manufacturing costs, the third inorganic layer is preferred.

It should be noted that the first inorganic layer, the second inorganic layer and the third inorganic layer may be made of silicon oxide, silicon nitride, or the like, and are preferably made of silicon oxide. The first organic layer, the second organic layer, the third organic layer, the fourth organic layer and the fifth organic layer may be made of organic silicone, or the like.

2. The first polarization layer comprises a first polarizer, and the second polarization layer comprises a second polarizer; wherein, a transmission axis of the first polarizer is perpendicular to a transmission axis of the second polarizer, the first polarizer and the second polarizer each comprise a light-transmitting portion and a polarization portion, areas where the polarization portions are located correspond to the non-lens area, and areas where the light-transmitting portions are located correspond to the lens area.

The first polarizer may comprise a PVA film that has a polarization effect to change natural light into polarized light. Because the PVA film is prone to hydrolysis, the first polarizer may further comprise TAC films respectively disposed on two sides of the PAV films to protect the physical properties of the PVA film. The structure of the second polarizer can be understood with reference to the structure of the first polarizer and will no longer be detailed here.

To guarantee normal display, the first polarizer and the second polarizer each comprise the light-transmitting portion and the polarization portion, wherein the light-transmitting portions allow light to pass through and do not have a polarization effect, and the polarization portions have a polarization effect.

The polarizer has the following characteristics: light parallel to the transmission axis of the polarizer is able to pass through the polarizer, and light perpendicular to the transmission axis is unable to pass through the polarizer. The transmission axis of the first polarizer is perpendicular to the transmission axis of the second polarizer, so that light emitted from the pixel layer to the non-lens area will be blocked by the second polarizer after passing through the first polarizer, and will not be radiated to the non-lens area.

It should be noted that the polarization unit comprising the first polarization layer and the second polarization layer is suitable for a case where light radiated to the polarization unit is non-polarized, and in this case, the display panel may be an OLED display panel.

If light radiated into the polarization units is polarized light (suitable for an LCD display panel), the polarization unit only needs to be provided with one polarization layer. Optionally, the display panel further comprises a third polarizer located on a side, close to the support layer, of the pixel layer. The polarization unit comprises a third polarization layer, and a transmission axis of the third polarization layer is perpendicular to a transmission axis of the third polarizer.

The third polarizer is used for display and differs from the first polarizer and the second polarizer in that all the area of the third polarizer has a polarization effect.

The transmission axis of the third polarization layer is perpendicular to the transmission axis of the third polarizer, so that light emitted from the pixel layer to the non-lens layer will be blocked by the third polarization layer after passing through the third polarizer, and will not be radiated to the lens area.

Optionally, the third polarization layer comprises a third wire grid polarizer, wherein the third wire grid polarizer comprises multiple parallel third protrusions arranged in a third direction, and a transmission axis of the third polarizer is perpendicular to the third direction.

The structure of the third wire grid polarizer is similar to that of the first wire grid polarizer, and will no longer be detailed here.

The transmission axis of the third polarizer is perpendicular to the third direction, that is to say, the transmission shaft of the third polarizer is perpendicular to the direction of the third protrusions, which ensures that the transmission axis of the third polarization layer is perpendicular to the transmission shaft of the third polarizer, so that light emitted from the pixel layer to the non-lens area will be blocked by the third wire grid polarizer after passing through the third polarizer, and will not be radiated to the non-lens area.

Optionally, to better block light radiated to the non-lens area, the third polarization layer is located on a side, close to the support layer, of the lens layer.

Optionally, to realize better 3D display, as shown in FIG. 3, the lens unit further comprises a dimming layer 32, wherein the dimming layer 32 is located on a side, away from the support layer, of the lens layer and covers the lens layer, and the refractive index of the lenses 31 is different from the refractive index of the dimming layer 32.

The refractive index of the lenses is different from the refractive index of the dimming layer means that the refractive index of the lenses is greater than the refractive index of the dimming layer or the refractive index of the lenses is smaller than the refractive index of the dimming layer. To guarantee better display, the refractive index of the lenses is preferably greater than the refractive index of the dimming layer, and in this case, the lenses may be made of high-refractive index silicone, and the dimming layer may be made of low-refractive index adhesive material.

Figure 12:
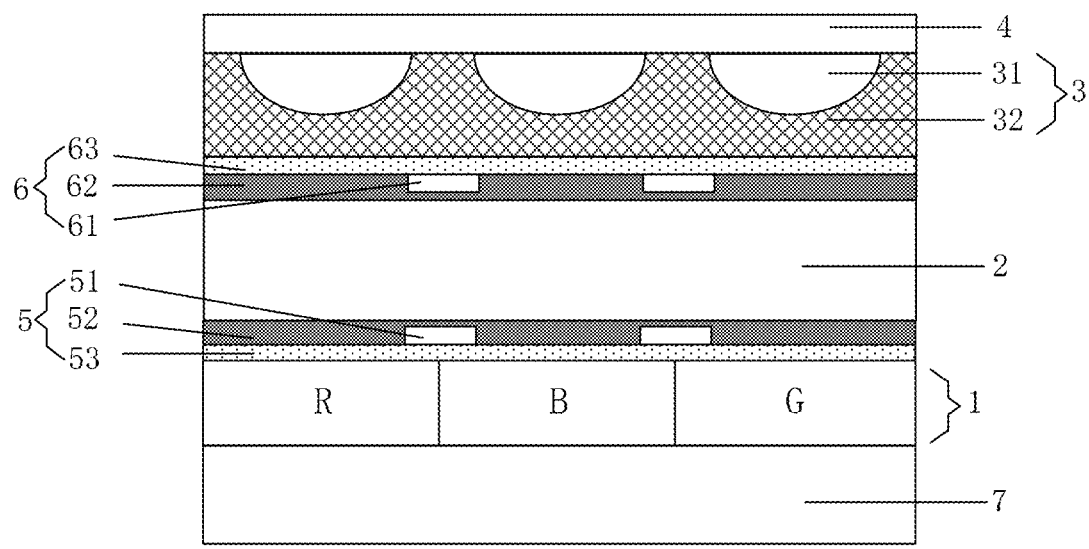
FIG. 12 is a structural diagram of a display panel according to another embodiment of the disclosure.

It should be noted that the dimming layer 32 may be located on a side, close to the support layer 2, of the lens layer (not shown in FIG. 12), as shown in FIG. 12, and in this case, the lenses 31 of the lens layer may protrude towards the support layer 2. In FIG. 12, the refractive index of the dimming layer 32 may be greater than the refractive index of the lenses; or, the refractive index of the dimming layer 32 may be smaller than the refractive index of the lenses 31. To guarantee better display, the refractive index of the dimming layer is preferably greater than the refractive index of the lenses 31, and in this case, the dimming layer may be made of high-refractive index silicone, and the lenses may be made of low-refractive index adhesive material.

To further improve the display effect, the structure of the dimming layer in FIG. 3 is preferred.

The embodiments of the disclosure further provide a displaying device comprising the display panel. The displaying device may be a display component such as an OLED displaying device, a Micro LED displaying device, a Mini LED displaying device and an LCD displaying device, or any products or units comprising the display component such as a television, a digital camera, a mobile phone or a tablet computer. Wherein, the OLED displaying device is an RGB OLED displaying device or a WOLED displaying device. The displaying device has a good 3D display effect and good user experience.

Figure 13:
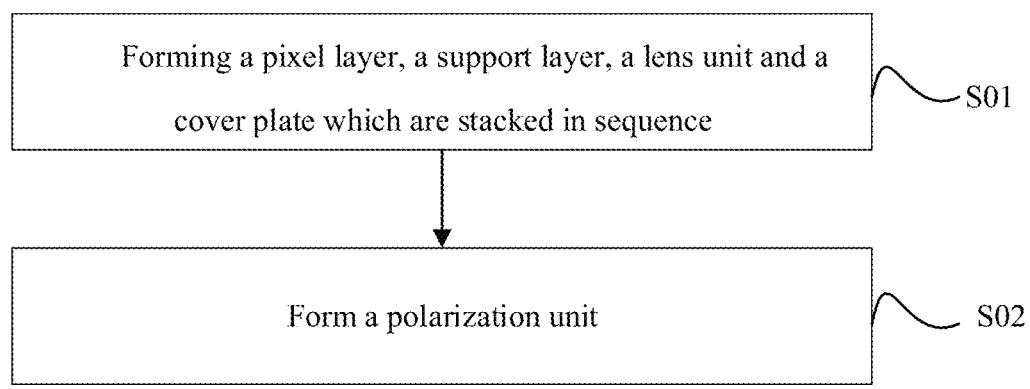
FIG. 13 is a flow diagram of a manufacturing method of a display panel according to one embodiment of the disclosure.

The embodiments of the disclosure further provide a manufacturing method of the display panel. As shown in FIG. 13, the manufacturing method comprises:

S01: forming the pixel layer, the support layer, the lens unit and the cover plate which are stacked in sequence, wherein the support layer is located on a light-emitting side of the pixel layer; and the lens unit comprises a lens layer, the lens layer comprises a lens area and a non-lens area, and the lens area comprises multiple lenses arranged in an array; and S02: forming the polarization unit, wherein the polarization unit is disposed on a light path between the pixel layer and the lens layer and is configured to filter out light emitted from the pixel layer to the non-lens area.

When the display panel manufactured by the method is used for 3D display, light emitted from the pixel layer to the non-lens area (stray light) is filtered out by the polarization unit, so that light radiated to the lens area will not be distributed by the stray light, thus avoiding interference caused by the stray light and improving the 3D display effect and the watch experience. The manufacturing method is simple, easy to implement, and high in operability.

The manufacturing method of the display panel of three different structures shown in FIG. 3, FIG. 5 and FIG. 6 will be described below with the display panel being a WOLED display panel and the pixel layer comprising a red filter layer R, a green filter layer G and a blue filter layer B as an example.

1. As shown in FIG. 3, the polarization unit of the display panel comprises a first polarization layer 5 and a second polarization layer 6, wherein the first polarization layer 5 is located between the pixel layer 1 and the support layer 2, the second polarization layer 6 is located between the support layer 2 and the lens layer, the first polarization layer 5 comprises a first wire grid polarizer, a first inorganic layer 53 and a first organic layer 52, and the second polarization layer 6 comprises a second wire grid polarizer, a second inorganic layer 63 and a second organic layer 62.

Figure 7:
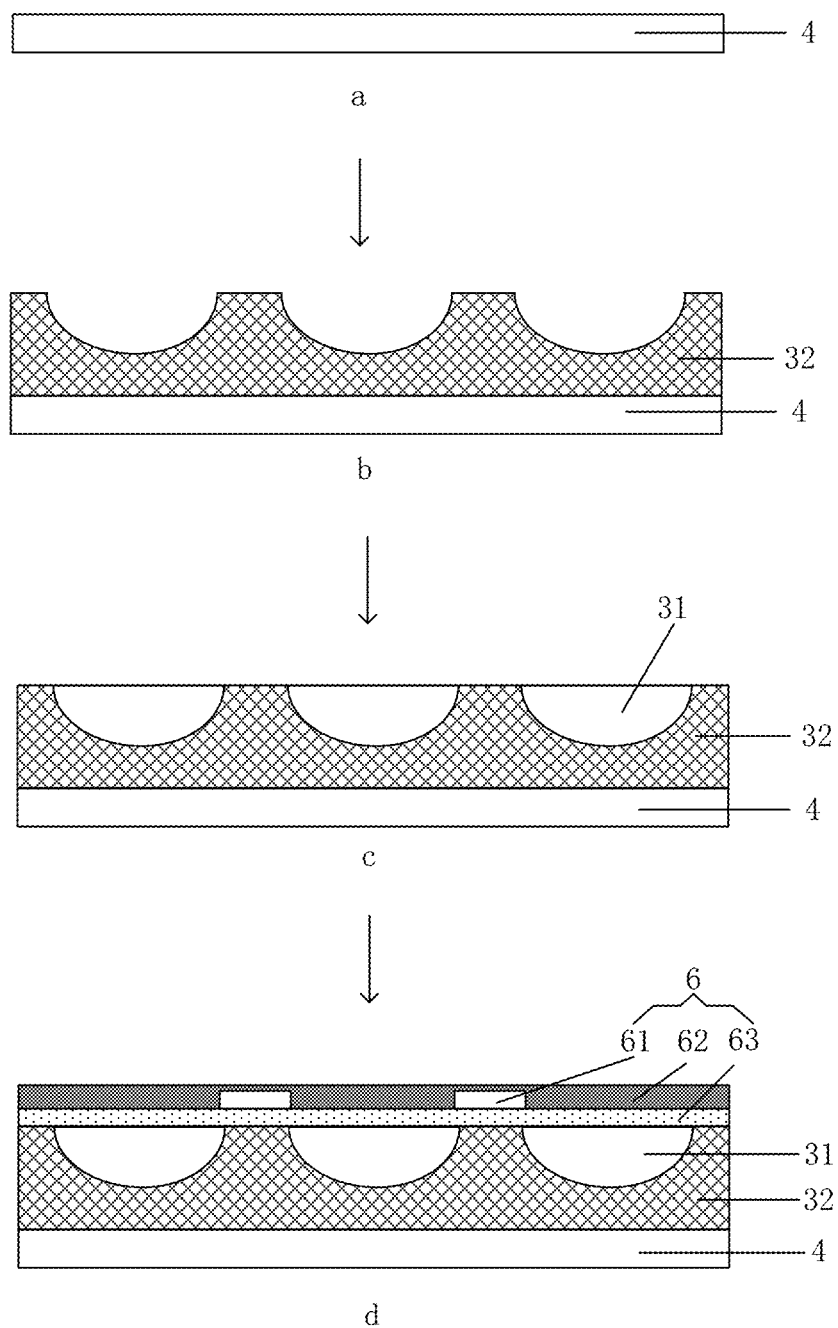
FIG. 7 is a flow diagram for forming a first cover plate structure according to one embodiment of the disclosure.
Figure 8:
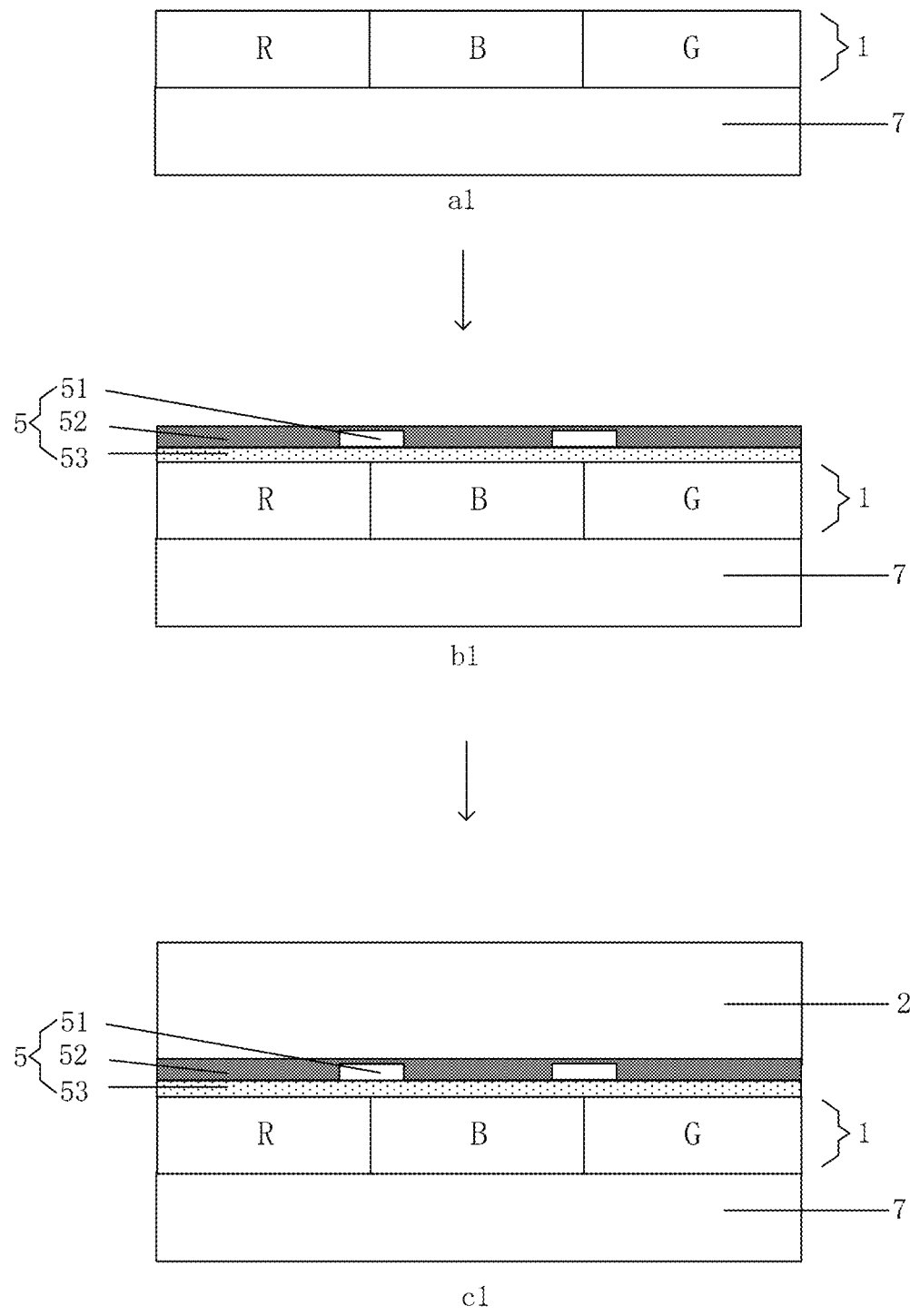
FIG. 8 is a flow diagram for forming a first substrate structure according to one embodiment of the disclosure.

The manufacturing method of the display panel shown in FIG. 3 comprises:

S11: forming a first cover plate structure shown by FIG. d in FIG. 7, wherein the first cover plate structure comprises the cover plate 4, the lens unit and the second polarization layer 6;

S12: forming a first substrate structure shown by FIG. c1 in FIG. 8, wherein the first substrate structure comprises a luminescent layer 7, the pixel layer 1, the polarization layer 5 and the support layer 2; and S13: aligning and attaching the first cover plate structure formed in S11 to the first substrate structure formed in S12 to form the display panel shown in FIG. 3.

Specifically, the structure formed in S11 may be turned to align and attach the second polarization layer to a side, away from the pixel layer, of the support layer in the first substrate structure with an optical curing adhesive to form the display panel shown in FIG. 3.

Optionally, forming the first cover plate structure in S11 comprises:

S111: forming the cover plate 4 shown by FIG. a in FIG. 7;

S112: forming a low-refractive index adhesive layer on the cover plate, and forming multiple grooves by a nano-imprinting technique to obtain a dimming layer 32 shown by FIG. b in FIG. 7, wherein the refractive index of the low-refractive index adhesive layer is about 1.4, and the grooves correspond to the lenses in shape;

S113: filling in the multiple grooves with high-refractive index silicone to form a lens layer, comprising multiple lenses 31, shown by FIG. c in FIG. 7, wherein the refractive index of the high-refractive index silicone is greater than 1.5;

S114: forming the second inorganic layer 63 shown by FIG. d in FIG. 7;

S115: forming a metallic aluminum film on the second inorganic layer, and patterning the metallic aluminum film to form the second wire grid polarizer, wherein the second wire grid polarizer comprises multiple parallel metal wires for forming second protrusions 61 shown by FIG. d in FIG. 7, and an area where the multiple metal wires are located corresponds to the non-lens area; and S116: forming the second organic layer 62 shown by FIG. d in FIG. 7 on the second wire grid polarizer, wherein the second organic layer covers the second wire grid polarizer and the second inorganic layer;

Wherein, the second inorganic layer, the second wire grid polarizer and the second organic layer constitute the second polarization layer.

By performing S111-S116, the first cover plate structure provided with the second wire grid polarizer and the lens unit may be formed.

Optionally, forming the first substrate structure in S12 comprises:

S121: sequentially forming the luminescent layer 7 and the pixel layer 1 shown by FIG. a1 in FIG. 8, wherein the pixel layer 1 comprises a red filter layer R, a green filter layer G and a blue filter layer B;

S122: forming the first inorganic layer 53 shown by FIG. b1 in FIG. 8 on the pixel layer;

S123: forming a metallic aluminum film on the first inorganic layer, and patterning the metallic aluminum film to form the first wire grid polarizer, wherein the first wire grid polarizer comprises multiple parallel metal wires for forming first protrusions 51 shown by FIG. b1 in FIG. 8, and an area where the multiple metal wires are located corresponds to the non-lens area;

S124: forming the first organic layer 52, covering the first wire grid polarizer, shown by FIG. c1 in FIG. 8, wherein the first inorganic layer, the first wire grid polarizer and the first organic layer constitute the first polarization layer; and S125: forming the support layer 2 shown by FIG. c1 in FIG. 8 on the first organic layer, wherein the support layer may be made of resin.

By performing S121-S125, the first substrate structure provided with the first wire grid polarizer may be formed.

2. As shown in FIG. 5, the polarization unit of the display panel comprises a first polarization layer 5 and a second polarization layer 6, wherein the first polarization layer 5 is located between the pixel layer 1 and the support layer 2, the second polarization layer 5 is located between the support layer 2 and the lens layer, the first polarization layer 5 comprises a first wire grid polarizer and a third organic layer 54, and the second polarization layer 6 comprises a second wire grid polarizer and a fourth organic layer 64.

Figure 9:
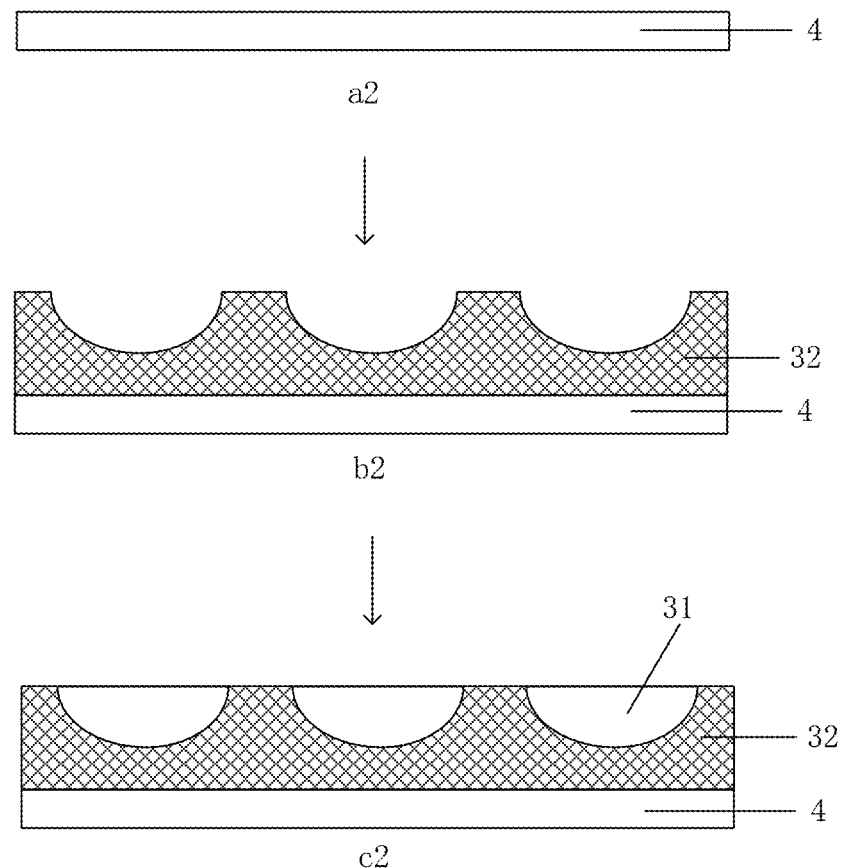
FIG. 9 is a flow diagram for forming a second cover plate structure according to one embodiment of the disclosure.
Figure 10:
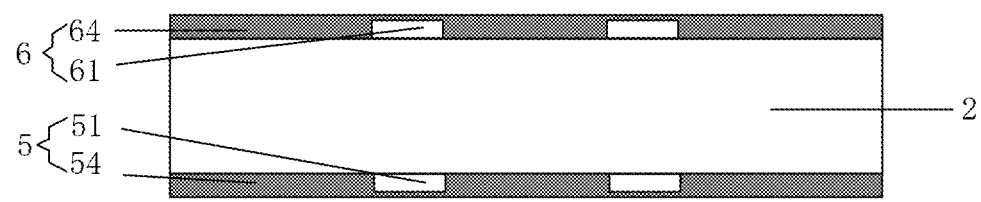
FIG. 10 is a structural diagram of a support structure according to one embodiment of the disclosure.
Figure 11:
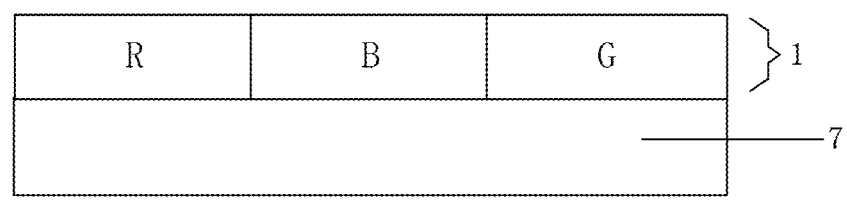
FIG. 11 is a structural diagram of a second substrate structure according to one embodiment of the disclosure.

The manufacturing method of the display panel shown in FIG. 5 comprises:

S21: forming a second cover plate structure shown in FIG. 9, wherein the second cover plate structure comprises the cover plate 4 and the lens unit;

S22: forming a support structure shown in FIG. 10, wherein the support structure comprises the support layer 2, and the first polarization layer 5 and the second polarization layer located on two sides of the support layer 2;

S23: forming a second substrate structure shown in FIG. 11, wherein the second substrate structure comprises a luminescent layer 7 and the pixel layer 1; and S24: aligning and attaching the second cover plate structure formed in S22 to the second substrate structure formed in S23 to form the display panel shown in FIG. 5.

Specifically, the second cover plate structure and the second substrate structure may be aligned and attached to the support structure with an optical curing adhesive, wherein the lens layer is aligned and attached to the second polarization layer, and the first polarization layer is aligned and attached to the pixel layer.

Optionally, forming the second cover plate structure in S21 comprises:

S211: forming the cover plate 4 shown by FIG. a2 in FIG. 9; and

S212: forming the lens unit on the cover plate, wherein as shown by FIG. b2 and FIG. b3 in FIG. 9, the lens unit comprises a dimming layer 32 and a lens layer, and the lens layer comprises multiple lenses 31.

Please refer to S112 and S113 for the specific method for forming the dimming layer and the lens layer, and unnecessary details will no longer be given here.

Optionally, forming the support structure in S22 comprises:

S221: forming the support layer 2 shown in FIG. 11, wherein the support layer may be made of glass;

S222: forming a metallic aluminum film on one side of the support layer, and patterning the metallic aluminum film to form the first wire grid polarizer, wherein the first wire grid polarizer comprises multiple parallel metal wires for forming first protrusions shown in FIG. 11, and an area where the multiple metal wires are located corresponds to the non-lens area;

S223: forming the third organic layer 54 shown in FIG. 11, wherein the third organic layer covers the first wire grid polarizer;

S224: forming a metallic aluminum film on the other side of the support layer, and patterning the metallic aluminum film to form the second wire grid polarizer, wherein the second wire grid polarizer comprises multiple parallel metal wires for forming second protrusions shown in FIG. 11, and an area where the multiple metal wires are located corresponds to the non-lens area; and S225: forming the fourth organic layer 64 shown in FIG. 11, wherein the fourth organic layer covers the second wire grid polarizer.

Optionally, forming the second substrate structure in S23 comprises:

S231: forming the luminescent layer 7 shown in FIG. 11; and

S232: forming the pixel layer 1 shown in FIG. 11, wherein the pixel layer 1 comprises a red filter layer R, a green filter layer G and a blue filter layer B.

3. As shown in FIG. 6, the polarization unit of the display panel comprises a first polarization layer 5 and a second polarization layer 6, wherein the first polarization layer 5 and the second polarization layer 6 are both located between the support layer 2 and the lens layer, the first polarization layer 5 comprises a first wire grid polarizer and a third inorganic layer, and the second polarization layer 6 comprises a second wire grid polarizer and a fifth organic layer 65.

The manufacturing method of the display panel shown in FIG. 6 comprises:

S31: forming a third substrate structure, wherein the third substrate structure comprises a luminescent layer, the pixel layer and the support layer;

S32: forming the polarization unit on the third substrate structure, wherein the polarization unit comprises the first polarization layer and the second polarization layer; and S33: sequentially forming the lens unit and the cover plate on the polarization unit.

Optionally, forming the third substrate structure in S31 comprises:

S311: sequentially forming the luminescent layer and the pixel layer, wherein the pixel layer comprises a red filter layer, a green filter layer and a blue filter layer; and S312: forming the support layer on the pixel layer.

Optionally, forming the polarization unit on the third substrate structure in S32 comprises:

S321: forming a metallic aluminum film on the support layer, and patterning the metallic aluminum film to form the first wire grid polarizer, wherein the first wire grid polarizer comprises multiple parallel metal wires, and an area where the multiple metal wires are located corresponds to the non-lens area;

S322: forming the third inorganic layer, wherein the third inorganic layer covers the first grid polarizer, and the third inorganic layer and the first wire grid polarizer constitute the first polarization layer;

S323: forming a metallic aluminum film on the third inorganic layer, and patterning the metallic aluminum film to form the second wire grid polarizer, wherein the second wire grid polarizer comprises multiple parallel metal wires, and an area where the multiple metal wires are located corresponds to the non-lens area; and S324: forming the fifth organic layer, wherein the fifth organic layer covers the second wire grid polarizer.

The second wire grid polarizer and the fifth organic layer constitute the second polarization layer.

Optionally, sequentially forming the lens unit and the cover plate on the polarization unit comprises:

S331: forming the lens layer on the fifth organic layer;

Specifically, the lens layer is formed by a thermal reflux process and may be made of high-refractive index silicone, and the refractive index of the high-refractive silicone is greater than 1.5;

S332: forming the dimming layer covering the lens layer;

The dimming layer may be made of low-refractive index adhesive material, and the refractive index of the low-refractive index adhesive layer is about 1.4.

S333: forming the cover plate on the dimming layer.

The cover plate may be made of glass.

The aforesaid description merely illustrates the specific implementations of the disclosure, and the protection scope of the disclosure is not limited to the above description. Any variations or substitutions easily obtained by any skilled in the art within the technical scope of the disclosure should also fall within the protection scope of the disclosure. Thus, the protection scope of the disclosure should be subject to the protection scope of the claims.

The invention claimed is:

1. A display panel, comprising a pixel layer, a support layer, a lens unit and a cover plate which are stacked in sequence, wherein:
   the support layer is located on a light-emitting side of the pixel layer;
   the lens unit comprises a lens layer, the lens layer comprises a lens area and a non-lens area, and the lens area comprises multiple lenses arranged in an array;
   the display panel further comprises a polarization unit disposed on a light path between the pixel layer and the lens layer and configured to filter out light emitted from the pixel layer to the non-lens area;
   the polarization unit comprises a first polarization layer and a second polarization layer, wherein the first polarization layer is closer to the pixel layer than the second polarization layer, and a transmission axis of the first polarization layer is perpendicular to a transmission axis of the second polarization layer;
   the first polarization layer comprises a first wire grid polarizer, and the second polarization layer comprises a second wire grid polarizer;
   wherein, the first wire grid polarizer comprises multiple parallel first protrusions arranged in a first direction;
   the second wire grid polarizer comprises multiple parallel second protrusions arranged in a second direction; and
   an area where the first protrusions are located and an area where the second protrusions are located correspond to the non-lens area, and the first direction is perpendicular to the second direction.

2. The display panel according to claim 1, wherein the first polarization layer further comprises a first inorganic layer and a first organic layer, and the second polarization layer further comprises a second inorganic layer and a second organic layer;
   the first organic layer is disposed on a side, closest to the support layer, of the pixel layer, the multiple first protrusions are disposed on a side, closest to the support layer, of the first inorganic layer, and the first organic layer covers the multiple first protrusions; and
   the second inorganic layer is disposed on a side, closest to the support layer, of the lens layer, the multiple second protrusions are disposed on a side, closest to the support layer, of the second organic layer, and the second organic layer is disposed on sides, closest to the support layer, of the multiple second protrusions.

3. The display panel according to claim 1, wherein the first polarization layer further comprises a third organic layer, and the second polarization layer further comprises a fourth organic layer;
   the multiple first protrusions are formed on a side, closest to the pixel layer, of the support layer, and the third organic layer is disposed on sides, closest to the pixel layer, of the multiple first protrusions; and
   the multiple second protrusions are formed on a side, closest to the lens layer, of the support layer, and the fourth organic layer covers the multiple second protrusions.

4. The display panel according to claim 1, wherein the first polarization layer further comprises a third inorganic layer, and the second polarization layer further comprises a fifth organic layer;
   the multiple parallel first protrusions are formed on a side, closest to the lens layer, of the support layer, and the third inorganic layer covers the multiple parallel first protrusions; and
   the multiple parallel second protrusions are formed on a side, closest to the lens layer, of the third inorganic layer, and the fifth organic layer covers the multiple parallel second protrusions.

5. The display panel according to claim 1, wherein the lens unit further comprises a dimming layer, the dimming layer is located on a side, farthest from the support layer, of the lens layer and covers the lens layer, and a refractive index of the lenses is different from a refractive index of the dimming layer.

6. The display panel according to claim 5, wherein the refractive index of the dimming layer is greater than the refractive index of the lenses.

7. The display panel according to claim 1, wherein the lenses are micro-lenses.

8. The display panel according to claim 1, wherein in a direction parallel to the support layer, a cross-section of the lenses is circular, elliptical, square or rectangular.

9. A displaying device, comprising the display panel according to claim 1.

10. A manufacturing method of the display panel according to claim 1, comprising:
    forming the pixel layer, the support layer, the lens unit and the cover plate which are stacked in sequence; and
    forming the polarization unit.

11. A display panel, comprising a pixel layer, a support layer, a lens unit and a cover plate which are stacked in sequence, wherein:
    the support layer is located on a light-emitting side of the pixel layer;
    the lens unit comprises a lens layer, the lens layer comprises a lens area and a non-lens area, and the lens area comprises multiple lenses arranged in an array;
    the display panel further comprises a polarization unit disposed on a light path between the pixel layer and the lens layer and configured to filter out light emitted from the pixel layer to the non-lens area;
    the polarization unit comprises a first polarization layer and a second polarization layer, wherein the first polarization layer is closer to the pixel layer than the second polarization layer, and a transmission axis of the first polarization layer is perpendicular to a transmission axis of the second polarization layer;
    the first polarization layer comprises a first polarizer, and the second polarization layer comprises a second polarizer;
    wherein, a transmission axis of the first polarizer is perpendicular to a transmission axis of the second polarizer, the first polarizer and the second polarizer each comprise a light-transmitting portion and a polarization portion, areas where the polarization portions are located correspond to the non-lens area, and areas where the light-transmitting portions are located correspond to the lens area.

12. The display panel according to claim 11, wherein the lens unit further comprises a dimming layer, the dimming layer is located on a side, farthest from the support layer, of the lens layer and covers the lens layer, and a refractive index of the lenses is different from a refractive index of the dimming layer.

13. The display panel according to claim 12, wherein the refractive index of the dimming layer is greater than the refractive index of the lenses.

14. The display panel according to claim 11, wherein the lenses are micro-lenses.

15. The display panel according to claim 11, wherein in a direction parallel to the support layer, a cross-section of the lenses is circular, elliptical, square or rectangular.

16. A display panel, comprising a pixel layer, a support layer, a lens unit and a cover plate which are stacked in sequence, wherein:
- the support layer is located on a light-emitting side of the pixel layer;
- the lens unit comprises a lens layer, the lens layer comprises a lens area and a non-lens area, and the lens area comprises multiple lenses arranged in an array;
- the display panel further comprises a polarization unit disposed on a light path between the pixel layer and the lens layer and configured to filter out light emitted from the pixel layer to the non-lens area;
- the display panel further comprises a third polarizer located on a side, closest to the support layer, of the pixel layer; and
- the polarization unit comprises a third polarization layer, and a transmission axis of the third polarization layer is perpendicular to a transmission axis of the third polarizer.

17. The display panel according to claim 16, wherein the third polarization layer comprises a third wire grid polarizer, and the third wire grid polarizer comprises multiple parallel third protrusions arranged in a third direction;
- wherein, the transmission axis of the third polarizer is perpendicular to the third direction.

18. The display panel according to claim 16, wherein the third polarization layer is located on a side, closest to the support layer, of the lens layer.

19. The display panel according to claim 16, wherein the lens unit further comprises a dimming layer, the dimming layer is located on a side, farthest from the support layer, of the lens layer and covers the lens layer, and a refractive index of the lenses is different from a refractive index of the dimming layer.

20. The display panel according to claim 19, wherein the refractive index of the dimming layer is greater than the refractive index of the lenses.

* * * * *